United States Patent
Payer et al.

(10) Patent No.: US 10,983,159 B2
(45) Date of Patent: Apr. 20, 2021

(54) METHOD AND APPARATUS FOR WIRING MULTIPLE TECHNOLOGY EVALUATION CIRCUITS

(71) Applicant: International Business Machines Corporation, Armonk, NY (US)

(72) Inventors: Stefan Payer, Stuttgart (DE); Michael Klein, Schoenaich (DE); Cedric Lichtenau, Stuttgart (DE); Ralf Richter, Lichtenstein (DE)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 16/226,942

(22) Filed: Dec. 20, 2018

(65) Prior Publication Data

US 2020/0200818 A1  Jun. 25, 2020

(51) Int. Cl.
*G01R 31/28* (2006.01)
(52) U.S. Cl.
CPC ..... *G01R 31/2834* (2013.01); *G01R 31/2851* (2013.01)
(58) Field of Classification Search
CPC ............ G01R 31/2834; G01R 31/2851; G01R 31/318563; G01R 31/318558
USPC .................................................. 324/762.01
See application file for complete search history.

(56) References Cited

U.S. PATENT DOCUMENTS

| | | | |
|---|---|---|---|
| 4,706,186 A * | 11/1987 | Mogi ..................... | G06F 11/273 700/7 |
| 7,340,659 B2 | 3/2008 | Balakrishnan | |
| 7,793,179 B2 * | 9/2010 | Sul ................. | G01R 31/318552 714/726 |
| 7,949,915 B2 * | 5/2011 | Chakraborty ......... | G06F 11/267 714/726 |
| 7,958,479 B2 * | 6/2011 | Chakraborty .. | G01R 31/318533 716/114 |
| 8,368,418 B2 | 2/2013 | Hasegawa | |
| 9,003,254 B2 * | 4/2015 | Ma ......................... | G06F 11/26 714/736 |
| 2007/0001790 A1 * | 1/2007 | Richmond ......... | G01R 31/2851 335/2 |

(Continued)

OTHER PUBLICATIONS

Kaware, U.W. et al., "A DFT technique for MCM (Multi Chip Module) testing," International Journal of Application or Innovation in Engineering & Management (IJAIEM), vol. 4, No. 1, Jan. 2015.

(Continued)

*Primary Examiner* — Christopher P McAndrew
(74) *Attorney, Agent, or Firm* — Scully, Scott, Murphy & Presser, P.C.

(57) ABSTRACT

A system, apparatus, and method of testing a plurality of test circuits is disclosed that includes inputting experiment data to the plurality of test circuits; applying a control signal to each of the plurality of test circuits to control application of the experiment data to the plurality of test circuits; and shifting the control signal in response to applying the control signal to each of the plurality of test circuits so that a different bit of the control signal is applied to each of the plurality of test circuits. The method in an aspect further comprises reading out a data out signal from each of the plurality of test circuits; and shifting the data out signal in response to reading out the data out signal from each of the plurality of test circuits.

17 Claims, 4 Drawing Sheets

(56) References Cited

U.S. PATENT DOCUMENTS

| | | | | |
|---|---|---|---|---|
| 2007/0132477 A1* | 6/2007 | Balog | G01R 31/2601 |
| | | | 324/762.01 |
| 2008/0141087 A1* | 6/2008 | Whetsel | G01R 31/3172 |
| | | | 714/726 |
| 2011/0291679 A1* | 12/2011 | Pagani | G01R 31/3172 |
| | | | 324/750.01 |
| 2012/0146673 A1* | 6/2012 | Kim | G01R 31/3187 |
| | | | 324/750.3 |
| 2012/0153982 A1* | 6/2012 | Lee | G01R 31/31908 |
| | | | 324/756.03 |
| 2013/0265831 A1* | 10/2013 | Miyaji | G11C 29/32 |
| | | | 365/189.04 |
| 2014/0172344 A1* | 6/2014 | Laird | G01R 31/2894 |
| | | | 702/117 |
| 2016/0178667 A1* | 6/2016 | Spehlmann | G01R 31/2601 |
| | | | 324/762.01 |
| 2016/0245858 A1* | 8/2016 | Bosques | G01R 1/0408 |
| 2017/0269147 A1* | 9/2017 | Rezgui | G01R 31/2834 |
| 2017/0285088 A1* | 10/2017 | Hernes | G01R 31/2851 |
| 2017/0352399 A1* | 12/2017 | Yokoyama | G11C 7/062 |
| 2018/0372794 A1* | 12/2018 | Roth | G01R 35/005 |
| 2019/0214378 A1* | 7/2019 | Franck | H02H 9/046 |
| 2019/0353696 A1* | 11/2019 | Hsu | G01R 31/31703 |

OTHER PUBLICATIONS

Cron, A. et al., "Reducing test costs through multisite and concurrent testing," Nov. 6, 2015.

* cited by examiner

METHOD AND APPARATUS FOR WIRING MULTIPLE TECHNOLOGY EVALUATION CIRCUITS

BACKGROUND

The present invention relates to integrated circuits, including Very Large Scale Integration (VLSI) silicon chip modules or packages, and methods and systems for evaluating and testing integrated circuits, silicon chips, VLSI chips, and/or technology.

With recent advancement of information technology and wide use of the Internet to store and process information, more and more demands are placed on the acquisition, processing, storage, and dissemination of information by information handling systems, e.g., computing systems. Information handling systems are being developed to increase the speed at which they are able to execute increasingly complex applications for business, personal use, and entertainment. Overall system performance is affected by each of the key elements of the information handling system, including the performance/structure of the integrated circuits or chips, processors, any memory devices or caches, input/output (I/O) subsystems, efficiency of the memory control functions, any associated memory interface elements, and the type and structure of the circuit interconnect interfaces.

The constantly increasing speed of information handling systems which execute increasingly complex applications places more rigorous performance demands on the multitude of integrated circuits or chips forming the circuitry in such systems. One manner to handle the increasing demands on such systems and circuitry has been the development of integrated circuits, and in particular Very Large Scale Integration (VLSI) silicon chip modules or packages.

Computing demands require the ability to access an increasing number of higher density devices at faster and faster access speeds. Extensive research and development efforts are invested by the industry to create improved and or innovative solutions to maximize overall chip performance by improving the design, structure, and/or the methods by which integrated circuits, including VLSI chips, and/or modules are made and operate. As CMOS technology evolves, structures and processes are getting more and more complex. As device scaling continues to facilitate increases in the number of devices, e.g., transistors, per unit area on the silicon chip, and increases the density of wires (e.g., conductive pathway routing), the ability to obtain acceptable yield results and manufacturability with acceptable quality is increasingly difficult. Smaller transistors and wires is pushing physics to its limit with worsening yields. With the improvements in new VLSI technology, the ability to easily test and evaluate the feasibility and manufacturability of new technology in an efficient and reliable manner is also increasingly difficult. There is an increasing need to be able to easily and efficiently test and evaluate new technology in order to, among other things, minimize design effort and cost. There is also a need for early design phase evaluation circuits to evaluate the feasibility of new technology and to minimize design effort.

SUMMARY

The summary of the disclosure is given to aid understanding the evaluation and testing of integrated circuits, including VLSI silicon chips containing integrated circuits, including a method and system of testing and evaluating the technology and operation of such integrated circuits, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the testing and evaluation methods, processes, circuits, packages, modules, systems, and schemes to achieve different effects.

In one or more embodiments, a method of testing a plurality of test circuits is disclosed that includes inputting experiment data to the plurality of test circuits; applying a control signal to each of the plurality of test circuits to control application of the experiment data to the plurality of test circuits; and shifting the control signal in response to applying the control signal to each of the plurality of test circuits so that a different bit of the control signal is applied to each of the plurality of test circuits. Inputting experiment data to the plurality of test circuits includes in an aspect connecting an input signal line to each of the plurality of test circuits, and in a further aspect, encoding all the experiment data on the input signal line. In one or more embodiments, applying a control signal to the plurality of test circuits includes connecting the same one or more bits of a bus to each of the plurality of test circuits, and in an aspect, applying the lowest one or more bits of the control signal to each of the plurality of test circuits. Experiment data in an embodiment includes first experiment data representative of a first experiment and second experiment data representative of a second experiment, and wherein the first experiment data is applied to all the plurality of test circuits prior to the second experiment data being applied to any of the plurality of test circuits. The method in one or more embodiments further includes reading out a data out signal from each of the plurality of test circuits; and shifting the data out signal in response to reading out the data out signal from each of the plurality of test circuits. Reading out the data out signal from each of the plurality of test circuits includes, in an embodiment, connecting the same one or more bits of a bus to each of the plurality of test circuits.

A system for testing a group of test circuits formed on a silicon chip together is also disclosed where the system includes a load input line to input experiment data to each of the plurality of test circuits, the load data input line connectible to each of the group of circuits; a control signal bus to receive and carry a control signal that control the application of the experiment data, the control signal bus connectable to each of the plurality of test circuits; and a plurality of shifters, one shifter for each test circuit in the group of test circuits to be tested together, each shifter connected to the control signal bus at a position after each test circuit of the group of test circuits, wherein each shifter is configured to shift a bit field applied to the shifter. The group of test circuits preferably are connected to the control signal bus at the same one or more bits, and wherein one of the shifters is connected to the control signal bus after each test circuit on the control signal bus. The system also includes in an embodiment a data out bus to receive the output from the plurality of test circuits, the data out bus connectable to each of the plurality of test circuits; and a plurality of shifters, one shifter for each test circuit in the group of test circuits to be tested together, each shifter connected to the data out bus at a position after each test circuit of the group of test circuits, wherein each shifter is configured to shift a bit field applied to the shifter. The shifter in an embodiment has a plurality of input lines and a plurality of output lines, the number of input lines equal to the number of output lines and equal to the number n bits of the control signal bus; wherein a first input line connects to an n last output line, and each subsequent input line connects to an (n−1) output line such that a bit field fed into the shifter is shifted so that its most significant digit (MSD) is output as the least significant digit (LSD) and all other bits in the bit field are shifter one place to the left.

An apparatus to change i inputs bits of an f bit field to a circuit where i<f is disclosed, where the apparatus has f input lines connected to f output lines, wherein the first i input lines are connected to the last i output lines, and the remaining input lines (f−i) are connected to remaining output lines (f−i) in a manner to shift the bit field i bits to the left. The apparatus in an embodiment outputs a bit field where each of the bits of the input bit field other than the most significant digit (MSD) is shifted one bit to the left and the MSD of the input bit field is shifted to become the least significant digit (LSD).

BRIEF DESCRIPTION OF THE DRAWINGS

The various aspects, features, and embodiments of the disclosed systems, circuits, structures, modules, packages, methods, and/or processes will be better understood when read in conjunction with the figures provided. Embodiments are provided in the figures for the purpose of illustrating aspects, features, and/or various embodiments of the systems, circuits, structures, modules, packages, methods, and/or processes, but the claims should not be limited to the precise systems, assemblies, subassemblies, arrangement, structures, features, aspects, embodiments, methods, processes, techniques, and/or devices shown, and the systems, assemblies, subassemblies, arrangements, structures, features, aspects, embodiments, methods, processes, techniques, and/or devices shown may be used singularly or in combination with other systems, assemblies, subassemblies, arrangements, structures, features, aspects, embodiments, methods, processes, techniques, and/or devices.

DETAILED DESCRIPTION

The following description is made for illustrating the general principles of the invention and is not meant to limit the inventive concepts claimed herein. In the following detailed description, numerous details are set forth in order to provide an understanding of a method, apparatus, and/or system of evaluating and testing integrated circuits and/or VLSI chips, including evaluating test circuits utilizing new technology, e.g., VLSI technology, however, it will be understood by those skilled in the art that different and numerous embodiments of the method, process, apparatus, and/or system of evaluating integrated circuits and/or VLSI chips, may be practiced without those specific details, and the claims and invention should not be limited to the embodiments, assemblies, subassemblies, structures, apparatus, systems, features, processes, methods, techniques, aspects, and/or details specifically described and shown herein. Further, particular features described herein can be used in combination with other described features in various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an", and "the" include plural referents unless otherwise specified, and that the terms "comprises" and/or "comprising" specify the presence of stated features, integers, steps, operations, elements, and/or components, but do not preclude the presence or addition of one or more features, integers, steps, operations, elements, components, and/or groups thereof.

One area where integrated circuits, and particularly VLSI chips and/or modules, are used is in the many circuits and systems utilized in computing or data processing systems. The computing systems may take many forms and integrated circuits, VLSI chips, and/or modules in an embodiment may include and/or form one or more processors, Random Access Memory (RAM) modules, nonvolatile memory, devices, device specific circuits, I/O interfaces, and I/O devices and peripherals. Integrated circuits, and VLSI chips, are used in many more circuits and systems beyond computing and/or data processing systems, and the disclosed system, apparatus, process, methods, and/or techniques should not be limited as such.

Integrated circuits, including VLSI circuits, are fabricated on a thin silicon wafer, also referred to as a silicon substrate. VLSI process technology fabricates circuits within and on the silicon substrate or wafer. Numerous transistors, diodes, resistors, capacitors and other devices, e.g., the chip devices and circuitry, are formed in the silicon substrate, and then thin metal layers or strips with insulating layers there between are formed on the silicon substrate. Power and signals are delivered or routed to the circuitry (e.g., transistors, diodes, resistors, capacitors, etc.) in the silicon substrate through the stack of metal layers. In one or more embodiments, conductive via structures interconnect multiple metal layers to form conductive routing paths for signals and power.

Increasing the density of transistors, circuitry devices, and wiring in integrated circuits and silicon chips is effecting manufacturing yields, and manufacturing yields are becoming increasingly important as the number of devices and wiring on each silicon chip increases. Evaluation circuits and sites are increasingly important in evaluating and testing new technology, to facilitate improvements, and fix problems in the circuits and technology that are being tested. For example, testing and evaluation of new technology (e.g., VLSI technology) is performed to check for uniformity, bad circuits, and/or slow transistors, among other things. Other testing is also performed. To test new technology being employed to manufacture integrated circuits, including VLSI technology, and the resulting physical structures, test circuits are fabricated on a test chip using the new technology, e.g., VLSI technology, and replicated numerous times within the test chip to make development efforts containable. In other words, a chip is manufactured using the new technology, e.g., the new VLSI technology, that replicates the same identical test circuit many, many times on the silicon chip. Each of those identical test circuits on the test chip are then tested using for example several different evaluation tests, e.g., experiments, to see if consistent results are being output.

Since there are many of the same test circuits on the test chip to be tested, the evaluation system, scheme, apparatus, process, and/or site preferably permits a number of test circuits on the chip to be evaluated and/or tested at the same time. That is, it is advantageous to evaluate and test several of the test circuits on the test chip simultaneously, e.g., in parallel. For example, eight (8) test circuits might be evaluated at the same time. In an example, it further would be beneficial to test one (1) to eight (8) out of a group of eight (8) test circuits at a time. Since the number of test circuits on a test chip is generally larger, and in embodiments, much larger by several factors, than the size of the group of test circuits that are simultaneously tested, it is advantageous to control and know if a test circuit is on and active during the testing. In other words, it is advantageous to select and/or control which test circuit(s) out of the group of test circuits is being tested.

Disclosed is a method, process, apparatus, and/or system to evaluate new technology, including for example, new VLSI technology, in a consistent and efficient manner. In an embodiment, the method, process, apparatus, and/or system evaluates new technology, including new technology incorporated in test circuits on a silicon test chip. In an embodiment, the method, process, apparatus, and/or system utilize the same experiment data applied to one or more test circuits in parallel, e.g., at the same time. In an aspect, the method, process, apparatus, and/or system reduces or eliminates test circuit personalization or customization.

In a further embodiment, the process, method, apparatus, and/or system can evaluate several test circuits on a test chip at the same time. In an embodiment, a method, apparatus, and/or system are disclosed that can evaluate n out of t test circuits at the same time, where n<=t. In an embodiment, one (1) to eight (8) out of a group of eight (8) test circuits on a test chip and/or section of the test chip are evaluated at the same time. In one or more embodiments, a method, apparatus, and/or system is disclosed where the one or more test circuits to which experiment data is applied is controllable so that the test circuits to which the experiment is applied may be selected. In an embodiment, the system utilizes one or more shifters to rotate or shift the input to the test circuits so that each experiment is applied to the same one or more bits of the test circuit, and/or the output of each test circuit is read from the same one or more bits.

Figure 1:
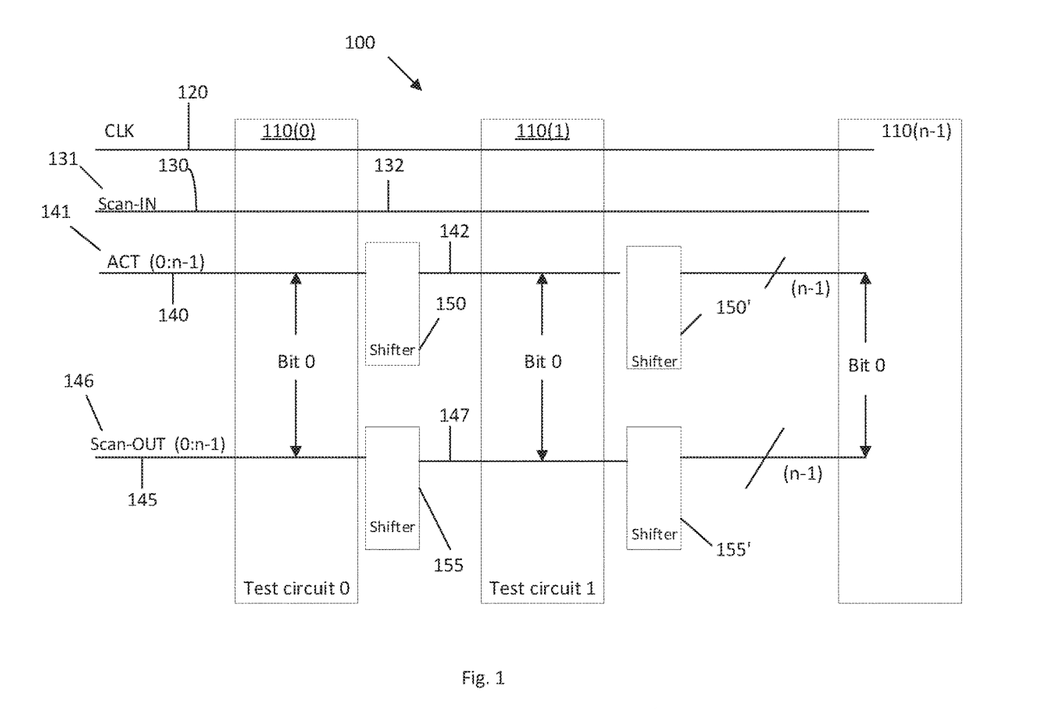
FIG. 1 depicts a block diagram of an embodiment of an apparatus and/or system for evaluating test circuits, according to the present disclosure.

FIG. 1 shows a block diagram of a evaluation system 100 for evaluating numerous of the same test circuits 110(0), 110(1), . . . , 110(n−1). FIG. 1 shows the interconnection of multiple test circuits 110. Each test circuit 110 is intended to be the same identical circuit. Each test circuit 110 is hooked up or connected to the bus in the same way in system 100. In FIG. 1 there is no difference in layout and connection of the test circuits 110. The hardware is identical across the system 100.

Each test circuit 110 is connected to one common clock (CLK) 120, which drives the flip-flops and test logic in the test circuits. A SCAN IN line 130 is connected to each test circuit 110. The input signals and/or experiment data 131 are input at SCAN IN line 130 and are applied to each of the test circuits 110:110(n−1). SCAN IN line 130 is the input signal to the test circuits 110 where experiment data is loaded into the numerous test circuits 110(0):110(n−1). The same experimental input data is feed to all the test circuits 110(0):110(n−1).

An activate input (ACT) line 140 is connected to each test circuit and provides an activate or control signal 141 to each test circuit 110. Activate input line 140 controls application of the experiments to the various test circuits 110. That is, the control signal 141 determines which one of the test circuits is on or off. If the ACT input is on, then the experiment applied at SCAN-IN is applied to the test circuit that is activated (on). Also, when the ACT signal 141 does not activate the test circuit, the experiment is not applied to that test circuit. The width of bus 142 for the activate input (ACT) line 140 depends upon the bit width m of the activate input signal 141 to each test circuit, times the number n of test circuits, e.g., width of bus 142 equals m*n. FIG. 1 illustrates a simplified example where the control or activate input signal 141 to each test circuit 110 is a single bit. In the simplified example of FIG. 1, where the control or activate input signal 141 to each test circuit uses a single bit, activate input line 140 is connected to each test circuit over an n-bit bus 142 that is run across all the test circuits 110, where n is the number of test circuits 110 for evaluation. Each test circuit 110 receives the activate input signal 141 from the same bit of that n-bit bus 142. In FIG. 1, each test circuit 110 receives the activate input signal 141 from the lowest bit (bit 0) of that n-bit bus 142. All experiments, e.g., load data, gets connected to the first signal on the activate input bus 142.

In addition, in FIG. 1, SCAN OUT line 145 is connected to each of the test circuits 110. The output signals or results 146, e.g., data, of the experiments are received, e.g., read out, on SCAN OUT line 145. The width of the bus 147 for the SCAN OUT line 145 depends upon the bit width of data, e.g., the width "s" of the SCAN OUT signal 141 from each test circuit 110, times the number of test circuits, e.g., width of bus 147 equals s*n. The width of bus 147 for SCAN OUT signals 146 is independent of the width of the bus 142 for the activate input line 140. FIG. 1 illustrates a simplified example where SCAN OUT signals 146 are read out on a single bit. In the simplified example of FIG. 1, where SCAN OUT signals 146 of the test circuits are read out over a single bit, SCAN OUT signals 146 are read out over an n-bit bus 147 that is run across all the test circuits 110, where n is the number of test circuits 110 for evaluation. Each test circuit 110 drives the same bit on that n-bit bus 147. In FIG. 1, each test circuit 110 drives or reads out the SCAN OUT signal 146 on the lowest bit (bit 0) of that n-bit bus 147.

A wire rotation circuit or shifter 150 is located on the n-bit bus 142 on the active input line 140 after each test circuit 110 (shifter 150 after the last test circuit 110(n−1) not shown in FIG. 1). A wire rotation circuit or shifter 155 is located on the n-bit 147 bus on the SCAN OUT line 145 after each test circuit 110 (shifter 155 after the last test circuit 110(n−1) not shown in FIG. 1). The shifters 150 and 155 after each test circuit presents a different bit of the original signal bit field to the next test circuit. The wire rotator or shifter 150 and 155 rotates or shifts its input and output signals to have each experiment connect at the same wiring track to the test circuits 110. In other words, the shifters 150 and 155 shift or rotate their inputs and outputs so data is applied to the same bit(s), or read out of the same bit(s), of the test circuits 110.

Figure 2:
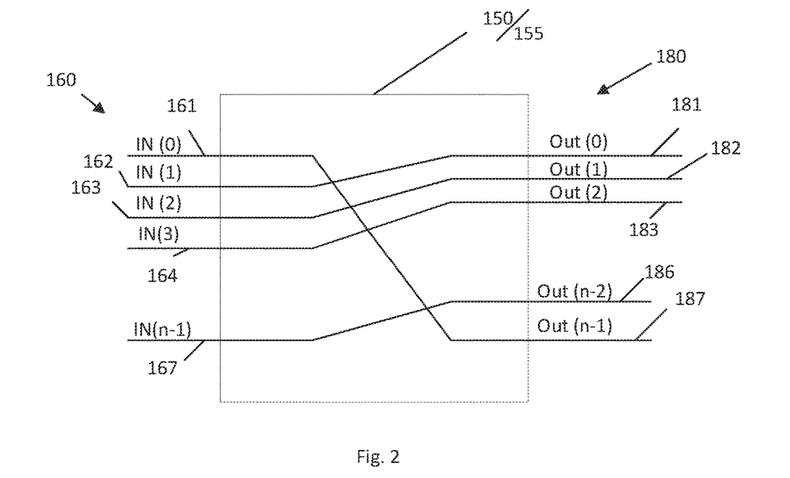
FIG. 2 depicts a diagram of an embodiment of a shifter used in the evaluation system, apparatus, and method of FIG. 1.

FIG. 2 is a diagrammatic representation of the connections inside the shifters 150 and 155 and shows how the input/output rotation is performed. The shifter 150 connects each test circuit 110 to the very same bit, which has the same experiment data in the system 100 of FIG. 1. In this manner, the same experiment is applied to each of the multiple test circuits 110 so no customization like adding wire identifiers (IDs), special logic, or latch circuitry within or around the test circuits 110 is necessary. The shifter 150 has a number of inputs 160 and outputs 180 where the inputs 160 are connected to the outputs 180 in a manner to shift or rotate the outputs. In the example of FIG. 1, shifter 150 has (n) inputs 160 and (n) outputs 180, where n is the number of circuits being tested, e.g., the number of test circuits 110 being tested in parallel. The shifter 150 is for the simplified case where only a single-bit control signal 141 is applied on the activate input line 140 to each test circuit 110.

In shifter 150, as shown in FIG. 2, an input bit 0 (IN (0), 161) is connected to output bit (n−1) (Out (n−1), 187). The input bit 1 (IN (1), 162) is connected to output bit (Out (0), 181) while input bit 2 (IN (2), 163) is connected to output bit 1 (Out (1), 182), and so on for all the other inputs 160 and outputs 180 as shown in FIG. 2. The shifter 155 in FIG. 1 has the same structure and connection of inputs and outputs as shifter 150, where the SCAN OUT line 145 has a single bit output.

An example A of activate or control signal 141 (m=1) applied to eight (8) test circuits (n=8) will help illustrate how evaluation system 100 works. Example A will include one experiment. The experiment data is connected to (loaded into) SCAN IN line 130 in system 100 in FIG. 1. The activate or control line 140 receives the control signal 141. The control signal 141 for each test circuit is only a single bit (m=1) so control line 140 is an eight (8) bit bus 142 since there are eight (8) test circuits (n=8) and bus width 142 equals m*n, or 1*8=8.

In example A, the experiment will be applied to test circuits 110(0), 110(2), 110(4), and 110(6), and will not be applied to test circuits 110(1), 110(3), 110(5), and 110(7) so the input bit field applied to the control or activate input line 140 will be (ACT 0:7)=b "10101010". In example A, every other test circuit will be turned on or activated and the test circuit will be tested. Applying "10101010" as the input signal 141 at activate or control line 140 sends first bit "1" (the most significant digit (msd)) to first test circuit 110(0) which activates or turns on test circuit 0 so that the experiment is performed. That is, with the activate input on, the experiment load data input at the SCAN IN line is applied to first test circuit 110(0) The signal (bit field 10101010) applied on the ACT IN line 140 is also applied (input) to shifter 150 where the first bit "1" of the bit field is shifted and output as the last bit (least significant digit, (lsd)) of the bit field, the second bit "0" of the bit field is shifted and output as the first bit (msd) of the bit field, and all the remaining bits in the control signal field are shifted so the signal "01010101" is the output of shifter 150.

The output of shifter 150 (bit field "01010101") is applied as control or activate signal 141 to test circuit 110(1) so first (msd) bit "0" is applied to test circuit 110(1) which leaves test circuit 110(1) off so the data is not applied to test circuit 110(1) and test circuit 110(1) is not tested. The signal "01010101" applied to circuit 110(1) is applied (input) to shifter 150' where the first (msd) bit "0" is shifted (rotated) and output as the last (lsd) bit, the second bit "1" is shifted (rotated) and output as the first (msd) bit, and all the remaining bits in the control signal field are shifted so the signal "10101010" is the output of shifter 150'.

The output of the shifter 150' (bit field "10101010") is applied as control or activate signal 141 to test circuit 110(2) so first (msd) bit "1" is applied to test circuit 110(2), which activates or turns on test circuit 110(2) so test circuit 110(2) is activated and test circuit 110(2) is tested. That is the data applied on the SCAN IN line 130 is applied to test circuit 110(2). The process continues where the output of test circuit 110(2) is applied (input) to the shifter 150", which shifts or rotates the control signal 141 (the bit field) so that the signal output from shifter 150" is "01010101" and is applied to test circuit 110(3) where bit 0 is the msd and is applied to the next test circuit 110(3) on the activate or control line 140. The process continues until the control signal 141 has been applied (input) to the last test circuit 110(7). After the control signal 141 input on ACT IN line 140 has passed through all the test circuits 110 and the shifter 150 (not shown in FIG. 1) located after the last test circuit 110(7), the control input signal 141 would be back to the original control signal 141, e.g., the bit field would be in the same order.

A similar process would occur on the SCAN OUT line 145 where SCAN OUT signal 146 would be an eight (8) bit output field. The shifters 155 would work in the same manner as shifters 150 to shift the output bit field. In this manner, the same output bits are read on SCAN OUT line 145.

Figure 3:
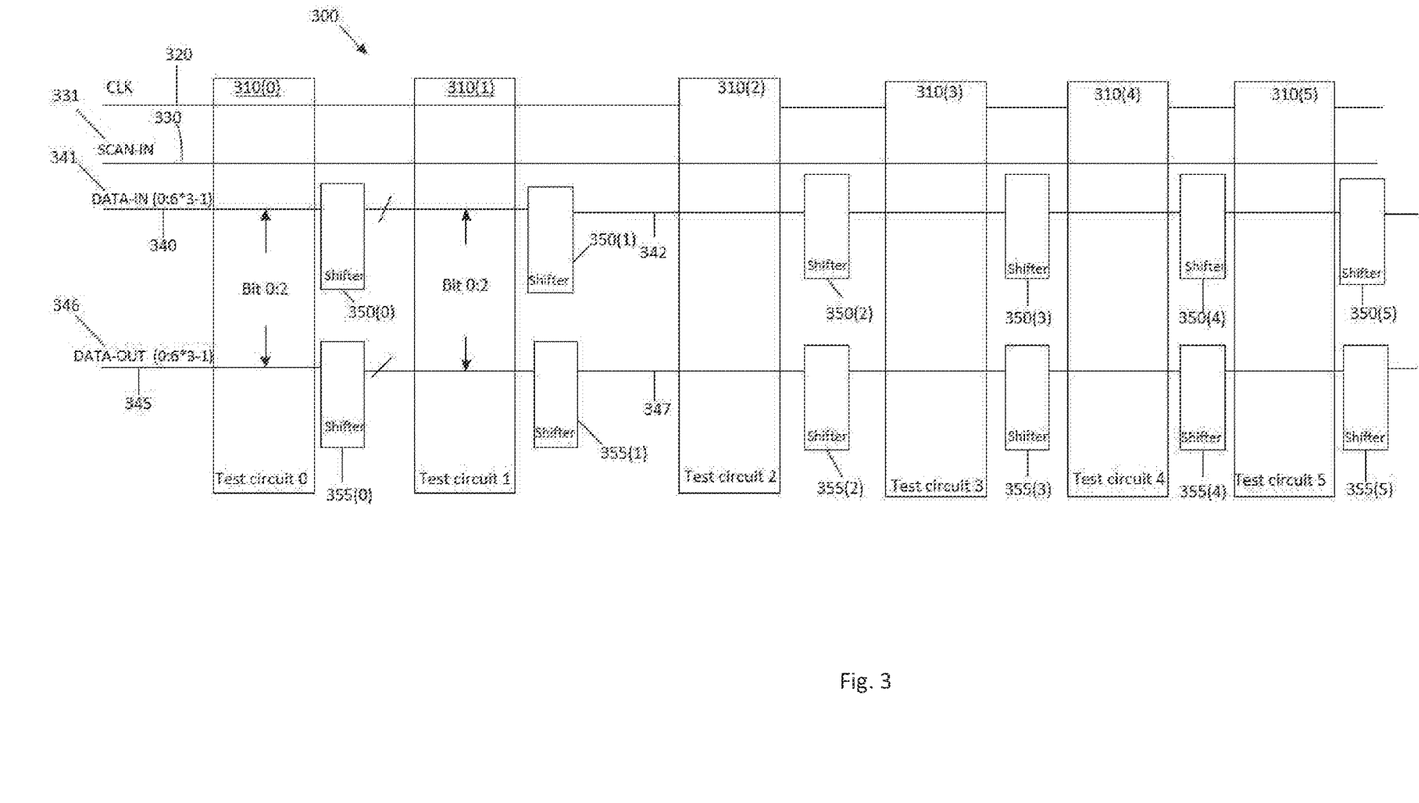
FIG. 3 depicts a block diagram of another embodiment of an apparatus and/or system for evaluating test circuits, according to the present disclosure.

FIG. 3 shows a block diagram of an evaluation system 300 for evaluating six (6) test circuits manufactured on a silicon test chip, where each test circuit 310(0), 310(1), . . . , 310(5) is intended to be the same identical test circuit. FIG. 3 shows the connection and interconnection of multiple test circuits 310(0):310(5). Each test circuit 310 is connected to one common clock 320, which drives the flip-flops and/or evaluation logic.

SCAN IN line 330 is connected to each test circuit 310 in FIG. 3. The input signals or data 331 of the experiment are applied at SCAN IN line 330 to each of the test circuits 310. Each test circuit 310 is hooked up or connected the same way in system 300. SCAN IN line 330 carries the input signal, e.g., experiment load data, and loads it into the six (6) test circuits 310. The same experimental input data is feed to all the test circuits 310.

Data input (DATA IN) line 340 is connected to each test circuit and provides an activate or control signal 341 to each test circuit 310. Data input line 340 controls application of the experiments to the various test circuits 310. FIG. 3 illustrates an example where activate or control signal 341 has three input bits for each test circuit 310. The width of bus 342 is based upon the width m of the activate input signal 341, which in FIG. 3 m=3, times the number n of the test circuits 310, which in FIG. 3 n=6. In the example of FIG. 3, where data input signal 341 to each test circuit 310 uses three bits, data input line 340 is an eighteen (18) bit bus 342 that is run across all the test circuits 310. Each test circuit 310 receives the data input signal 341 from the same three bits of that eighteen (18) bit bus 342. In an embodiment, each test circuit 310 receives the data input from the lowest three (3) bits of that eighteen (18) bit bus 342.

In addition, in FIG. 3 data output (DATA-OUT) line 345 is connected to each of the six (6) test circuits 310. The output signals or results 346, e.g., data, of the experiments are received, e.g., read out, on data output line 345. FIG. 3 illustrates an example where data output signals 346 are read out on three bits. In the example of FIG. 3, where data output signals 346 of the test circuits 310 are read out over three (3) bits, data output line 345 is an eighteen (18) bit bus 347 that is run across all six (6) of the test circuits 310. Each test circuit 310 drives the same three (3) bits on that 18-bit bus. In an embodiment, each test circuit 310 drives or reads out the data output signal 345 on the lowest 3 bits of that 18-bit bus 347.

A wire rotation circuit or shifter 350 is located on the eighteen (18) bit bus 342 on the data input line 340 after each test circuit 310. A wire rotation circuit or shifter 355 is located on the eighteen (18) bit bus 347 on the data output line 345 after each test circuit 310. The wire rotator or shifter 350 and 355 rotates or shifts its input and output signals so that each experiment, e.g., load data, connects at the same wiring track to the test circuits. That is the order of the physical position of specific wires is changed.

Figure 4:
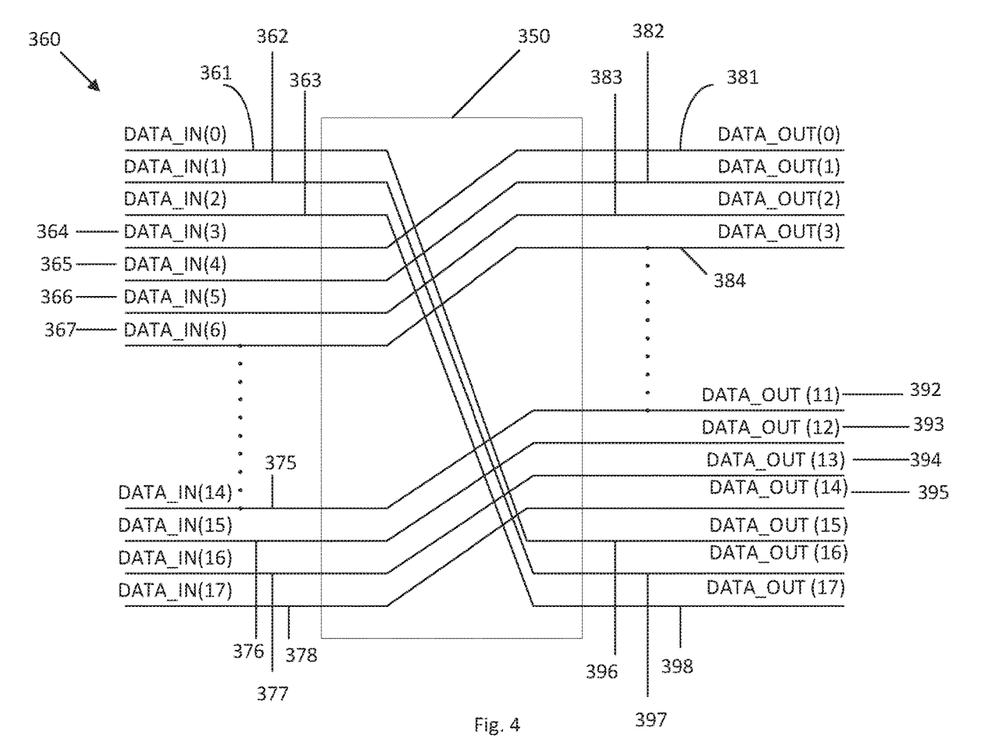
FIG. 4 depicts a diagram of another embodiment of a shifter used in the evaluation system, apparatus, and method of FIG. 3.

FIG. 4 is a diagrammatic representation of the connections inside the shifter 350 and shifter 355, and illustrates how the input/output rotation is performed. The shifter 350 connects each test circuit 310 to the very same three (3) bits. In this manner, the same experiment data is applied to each of the multiple test circuits 310 so no customization like adding wire IDs, special logic, or latch circuitry within or around the test circuitry is necessary. The shifter 350 has a number of inputs 360 and outputs 380 where the inputs 360 of the shifter 350 are connected to the outputs 380 in a manner to shift or rotate the inputs. The shifter 350 is for the case where three data input (control) signals 341 are applied on the data input line 340 to each test circuit 310. In the example of FIG. 3, shifter 350 has eighteen (18) inputs 360 and eighteen (18) outputs 380, where there are three (3) data input signals 341 being applied to each test circuit, and there are six (6) test circuits being tested simultaneously, e.g., in parallel. In other words, shifter 350 is for three bit wide data input signal 341 for six (6) test circuits which results in an eighteen (18) bit wide bus 342 for data input line 340 in FIG. 3.

In shifter 350, as shown in FIG. 4, data input bits (IN 0:2, 361, 362, 363) are connected to output bits (Out 15:17, 396, 397, 398, respectively). Data input bits (IN 3:5, 364, 365, 366) are connected to data output bits (Out 0:2, 381, 382, 383, respectively), while data input bits (IN 6:8, 367, 368, 369) are connected to data output bits (Out 3:5, 384, 385, 386, respectively), and so on for all the other inputs 360 and outputs 380 as illustrated in FIG. 4. The shifter 355 in FIGS. 3 and 4 would have the same structure and connection of inputs and outputs as shifter 350 where the SCAN OUT line 345 has a three (3) bit output.

In one or more embodiments, a shifter, like shifters 150, 155, 350, and 355, can also be used on the SCAN In line in FIGS. 1 and 3. Using a shifter on the SCAN IN line would enable testing different scenarios per instance of test circuit. Adding a rotator/shifter to the SCAN IN line would permit the application of different data to each experiment, which allows testing each test circuit with different data sets.

Figure 5A:
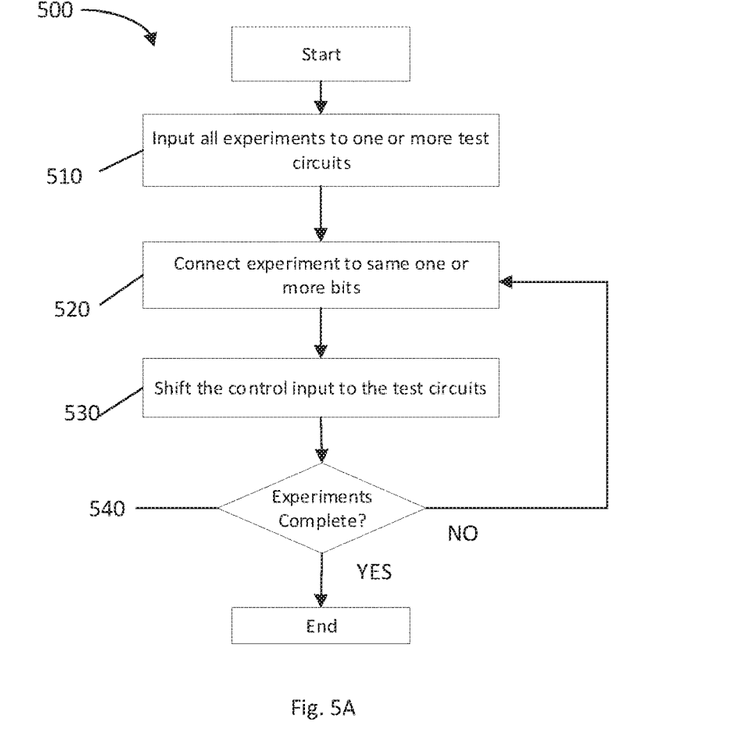
FIG. 5A depicts a flow chart of a method of controlling the inputs to an evaluation system.
Figure 5B:
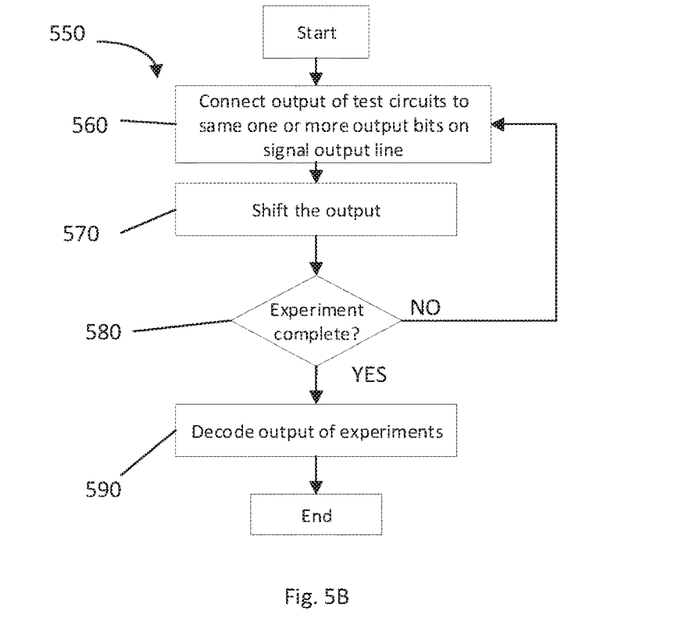
FIG. 5B depicts a flow chart of a method of reading the outputs from an evaluation system.

FIGS. 5A and 5B illustrate exemplary flowcharts in accordance with one embodiment describing a method for evaluating new technology, in particular evaluating new technology and/or test circuits incorporating new technology, and more particularly a method of providing the same experiment load data to a number of test circuits simultaneously, e.g., in parallel, and/or reading the output of the test circuits to which the experiments are applied. While the methods are described for the sake of convenience and not with an intent of limiting the disclosure as comprising a series and/or a number of steps, it is to be understood that the one or more processes do not need to be performed as a series of steps and/or the steps do not need to be performed in the order shown and described with respect to FIGS. 5A, and 5B, but the one or more processes may be integrated and/or one or more steps may be performed together, or the steps may be performed in the order disclosed or in an alternate order.

FIG. 5A shows a flowchart of a method 500 of evaluating new technology, in particular evaluating test circuits incorporating the new technology, and more particularly a method 500 of providing and/or applying the same experiments, e.g., load data, to a group of test circuits simultaneously, e.g., in parallel. At 510 all of the experiment data are input into, for example, the system. In an embodiment, encode input for all experiments. In an aspect, for each experiment i {all_inps+= inp_exp(i)*2^i}. In one or more embodiments, an input line to load data is connected to the one or more test circuits, preferably all of a group of test circuits.

At 520, connect the one or more experiments, load data, to one or more test circuits, preferably all the test circuits in the group. The experiments preferably are all connected on the same one or more bits, preferably the lower or lowest bits. In one or more embodiments, a control signal line is connected to the one or more test circuits, preferably all of the group of test circuits, and the control signal line is connected to the same one or more bits of all the test circuits, preferably to the lowest bit or lower bits of the test circuits. In an aspect exp(i).inp=all_inps(0). At 530, shift the control input to each successive test circuit. In an embodiment, the input to each successive test circuit is shifted, e.g., rotated, using a shifter, e.g., shifter 150, that in an aspect is located after all the test circuits. Shifting the control input controls the application of the experiments to the test circuits. In an aspect, all_inps=all_inps/2. At 540 determine whether all the experiments have been run and are complete. Is i<exp_count? If not all the experiments have been performed (540:No), then proceed to 520 and repeat 520 and 530 until all experiments have been run on all the test circuits at which point 540 is complete (540:Yes) and the process ends. In this manner, all the same experiment load data will be applied to the test circuits in the same way, but the particular instance of application of each experiment to each test circuit can be controlled.

FIG. 5B shows a flow chart of a method 550 of evaluating new technology, in particular evaluating test circuits incorporating the new technology, and more particularly a method 550 of providing the same experiments data to a number of test circuits simultaneously, e.g., in parallel, and reading out and/or decoding the results. At 560, connect the output of the group of test circuits to one or more output bits on same signal output line. Preferably, connect the same output bits of the test circuits, more preferably the lower one or more bit(s), or lowest bit, on the signal output line. In an aspect, exp(i).out=all_outs(0). At 570, the output bits of the test circuits are shifted, preferably using shifter 155. That is after the output signal of a first test circuit is read out, the bits on the output signal bus are shifted, and the output signal on the next test circuit is read out, and the process continues shifting the bits on the output signal line after each test circuit of the group of test circuits. In one or more embodiments, the output of the test circuits are read out. In an aspect, all_outs=all_outs*2. At 580, it is determined whether all the experiments have been performed, e.g., whether the number of experiments input into the system have been applied to all the test circuits. If the number of experiments to be performed are not complete (580:No), then the process loops back and continues at 560 and 570 where the next experiment is applied to the test circuits. If the experiments are complete (580:Yes), then the process continues to 590 where the output of the experiments are decoded. In an aspect, for each experiment i {out_exp (i)=all_outs (1*i)}.

Aspects of the present invention are described herein with reference to flowchart illustrations and/or block diagrams of methods, and apparatus (systems). It will be understood that each block of the flowchart illustrations and/or block diagrams, and combinations of blocks in the flowchart illustrations and/or block diagrams, can be implemented by circuitry, semiconductor processors, structures and/or techniques. The flowchart and block diagrams in the figures illustrate the architecture, functionality, and operation of possible implementations of systems, apparatus, and methods, according to various embodiments of the present invention. In this regard, each block in the flowchart or block diagrams may represent a module, segment, circuitry, or portions of integrated circuits, silicon chips and semi-conductors, and/or instructions for implementing the specified function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by other structures that perform the specified functions or acts. It will be clear that the various features of the foregoing systems and/or methodologies may be combined in any way, creating a plurality of combinations from the descriptions presented above.

While the illustrative embodiments described above are preferably implemented in hardware, various aspects of the illustrative embodiments may be implemented in software as well. For example, it will be understood that each block of the flowchart illustration in FIGS. 5A and 5B, and combinations of blocks in the flowchart illustration, can be implemented by hardware, computer program instructions, and/or combinations thereof. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of testing a plurality of test circuits comprising:
    inputting experiment data to the plurality of test circuits;
    applying a control signal to each of the plurality of test circuits to control application of the experiment data to the plurality of test circuits; and
    shifting the control signal in response to applying the control signal to each of the plurality of test circuits so that a different bit of the control signal is applied to each of the plurality of test circuits,
    wherein the control signal comprises a bit field and shifting the control signal includes changing the most significant digit (MSD) in the bit field of the control signal to be the least significant digit (LSD) in the bit field, and shifting the remaining bits in the bit field one place to the left.

2. The method if claim 1, wherein inputting experiment data to the plurality of test circuits includes connecting an input signal line to each of the plurality of test circuits.

3. The method according to claim 2, wherein inputting experiment data includes encoding all the experiment data on the input signal line.

4. The method according to claim 1, wherein applying a control signal to the plurality of test circuits includes connecting the same one or more bits of a bus to each of the plurality of test circuits.

5. The method according to claim 4, wherein applying a control signal to each of the plurality of test circuits includes applying the lowest one or more bits of the control signal to each of the plurality of test circuits.

6. The method of claim 1, wherein the experiment data includes first experiment data representative of a first experiment and second experiment data representative of a second experiment, and wherein the first experiment data is applied to all the plurality of test circuits prior to the second experiment data being applied to any of the plurality of test circuits.

7. The method of claim 1, wherein the control signal comprises a plurality of bits.

8. The method of claim 1, wherein a control signal line for carrying the control signal connects to the plurality of test circuits and shifting the control signal is performed by a plurality of shifters connected to the control signal line wherein one shifter is connected after each of the plurality of test circuits.

9. The method of claim 1, further comprising:
    reading out a data out signal from each of the plurality of test circuits; and
    shifting the data out signal in response to reading out the data out signal from each of the plurality of test circuits.

10. The method of claim 9, wherein reading out the data out signal from each of the plurality of test circuits includes connecting the same one or more bits of a bus to each of the plurality of test circuits.

11. A system for testing a group of test circuits formed on a silicon chip together, comprising:
    a load input line to input experiment data to each of the plurality of test circuits, the load data input line connectible to each of the group of circuits;
    a control signal bus to receive and carry a control signal that control the application of the experiment data, the control signal bus connectable to each of the plurality of test circuits; and a plurality of shifters, one shifter for each test circuit in the group of test circuits to be tested together, each shifter connected to the control signal bus at a position after each test circuit of the group of test circuits, wherein each shifter is configured to shift a bit field applied to the shifter, wherein the shifter has a plurality of input lines and a plurality of output lines, the number of input lines equal to the number of output lines and equal to the number n bits of the control signal bus; wherein a first input line connects to an n last output line, and each subsequent input line connects to an (n−1) output line such that a bit field fed into the shifter is shifted so that its most significant digit (MSD) is output as the least significant digit (LSD) and all other bits in the bit field are shifter one place to the left.

12. The system of claim 11, wherein the group of test circuits are connected to the control signal bus at the same one or more bits, and wherein one of the shifters is connected to the control signal bus after each test circuit on the control signal bus.

13. The method of claim 11, wherein the control signal bus is a multi-bit bus and the system is configured so that the control signal bus is connectable to each of the plurality of test circuits at the same one of more bits.

14. The system of claim 11, further comprising:
a data out bus to receive the output from the plurality of test circuits, the data out bus connectable to each of the plurality of test circuits; and
a plurality of shifters, one shifter for each test circuit in the group of test circuits to be tested together, each shifter connected to the data out bus at a position after each test circuit of the group of test circuits, wherein each shifter is configured to shift a bit field applied to the shifter.

15. The system of claim 14, wherein the data out bus is a multi-bit bus and the system is configured so that the control signal bus is connectable to each of test circuits of the group of test circuits at the same one or more bits.

16. The system of claim 14, wherein the group of test circuits are connected to the load data input line, the control signal bus, and the data out bus, and the group of test circuits are connected to the control signal bus and to the data out bus at the same one or more bits, and one of the shifters is connected to the control signal bus after each test circuit on the control signal bus, and one of the shifters is connected to the data out bus after each test circuit on the data out bus.

17. An apparatus for testing a plurality of test circuits by shifting i input bits of an f bit field where i<f, the apparatus comprising:
f input lines connected to f output lines, wherein the first i input lines are connected to the last i output lines, and the remaining input lines (f−i) are to connected to remaining output lines (f−i) in a manner to shift the bit field i bits to the left,
wherein the apparatus outputs a bit field where each of the bits of the input bit field other than the most significant digit (MSD) is shifted one bit to the left and the MSD of the input bit field is shifted to become the least significant digit (LSD).

* * * * *